United States Patent
Guenther et al.

(10) Patent No.: US 7,423,375 B2
(45) Date of Patent: Sep. 9, 2008

(54) ENCAPSULATION FOR ELECTROLUMINESCENT DEVICES

(75) Inventors: Ewald Guenther, Singapore (SG); Hooi Bin Lim, Penang (MY); Shi Chai Chong, Penang (MY); David Lacey, Mountain View, CA (US)

(73) Assignee: OSRAM GmbH, Munich (DE)

( * ) Notice: Subject to any disclaimer, the term of this patent is extended or adjusted under 35 U.S.C. 154(b) by 0 days.

(21) Appl. No.: 10/142,208

(22) Filed: May 7, 2002

(65) Prior Publication Data

US 2003/0209979 A1    Nov. 13, 2003

(51) Int. Cl.
 *H05B 33/04* (2006.01)
(52) U.S. Cl. .......... 313/512; 313/506; 428/690; 428/917; 445/24; 445/25
(58) Field of Classification Search .......... 313/512, 313/509, 507, 504, 498; 349/69
See application file for complete search history.

(56) References Cited

U.S. PATENT DOCUMENTS

| | | | | |
|---|---|---|---|---|
| 4,954,746 A | * | 9/1990 | Taniguchi et al. | 313/506 |
| 5,059,148 A | * | 10/1991 | McKenna et al. | 445/25 |
| 5,427,858 A | * | 6/1995 | Nakamura et al. | 428/421 |
| 5,962,962 A | * | 10/1999 | Fujita et al. | 313/412 |
| 5,965,981 A | * | 10/1999 | Inoguchi et al. | 313/506 |
| 6,147,442 A | * | 11/2000 | Codama et al. | 313/292 |
| 6,195,142 B1 | * | 2/2001 | Gyotoku et al. | 349/69 |
| 6,498,428 B1 | * | 12/2002 | Matsuura et al. | 313/506 |
| 6,522,067 B1 | | 2/2003 | Graff et al. | |
| 6,590,337 B1 | * | 7/2003 | Nishikawa et al. | 313/509 |
| 6,605,826 B2 | * | 8/2003 | Yamazaki et al. | 257/72 |
| 6,624,570 B1 | * | 9/2003 | Nishio et al. | 313/506 |
| 6,624,572 B1 | * | 9/2003 | Kim et al. | 313/512 |
| 6,633,121 B2 | | 10/2003 | Eida et al. | 313/504 |
| 6,888,308 B1 | * | 5/2005 | Guenther | 313/512 |
| 2001/0017516 A1 | | 8/2001 | Guenther | |
| 2003/0062830 A1 | * | 4/2003 | Guenther et al. | 313/512 |
| 2003/0094691 A1 | | 5/2003 | Auch et al. | |
| 2003/0214232 A1 | * | 11/2003 | Guenther et al. | 313/512 |

FOREIGN PATENT DOCUMENTS

| | | |
|---|---|---|
| JP | 2001-102166 | 4/2001 |
| WO | WO98/53644 | 11/1998 |
| WO | WO01/44865 | 6/2001 |
| WO | WO01/45140 | 6/2001 |
| WO | WO02/21883 | 3/2002 |

* cited by examiner

*Primary Examiner*—Sikha Roy
(74) *Attorney, Agent, or Firm*—Fish & Richardson P.C.

(57) ABSTRACT

An electroluminescent device having a protection layer in the cap bonding region to which the cap is bonded. The protection layer can be formed from photosensitive or non-photosensitive materials. The protection layer protects the layers below from being damage during removal of polymer materials.

12 Claims, 5 Drawing Sheets

ENCAPSULATION FOR ELECTROLUMINESCENT DEVICES

FIELD OF THE INVENTION

The present invention relates to electroluminescent devices. More particularly, the invention relates to the improved encapsulation for electroluminescent devices.

BACKGROUND OF THE INVENTION

FIG. 1 shows a conventional electroluminescent device 100 having one or more organic light emitting (OLED) cells. An OLED cell includes a functional stack of one or more organic functional layers 110 between a transparent conductive layer 105 (e.g., indium tin oxide or ITO) and a conductive layer 115. The conductive layers serve as electrodes. The cells are fabricated on the substrate. The cells can be configured as desired to form a display or lamp. A metallization layer can be formed over the first conductive layer to form interconnections to the electrodes and bond pads 150. The bond pads are coupled to, for example, driving circuitry to control the operation of the OLED cells. A cap 160, which forms a cavity 145, encapsulates the device, hermetically sealing the OLED cells to protect them from the environment (e.g., moisture and/or air.)

In operation, charge carriers are injected through the electrodes for recombination in the functional layers. The recombination of the charge carriers causes the functional layer of the cells to emit visible radiation.

Techniques for depositing polymers include, for example, spin-coating or doctor blading. Such techniques coat the entire substrate surface. Since polymer materials are very soft and partially hygroscopic, they need to be completely removed from the area where the cap is bonded (e.g., cap bonding area) to the substrate. Furthermore, since bond pads are typically formed prior to the deposition of polymer materials, they need to be removed from above the bond pads in order to expose them for coupling to the driving circuitry.

However, limited techniques are available for patterning polymer materials. This is because most techniques which require chemistry (dry or wet) are incompatible with the sensitive polymer materials. A commonly used patterning technique is laser ablation. When laser ablation is used, high laser intensities and long irradiation times are required to remove the polymer materials from selected areas of the substrate. High laser intensities and long irradiation times can damage the metallization or ITO layer beneath the polymers, adversely affecting the device. Moreover, laser ablation may not be able to completely remove the polymer materials since optical absorption decreases as the layer becomes thinner. Incomplete removal of polymer materials from the cap bonding area can result in defective encapsulation, causing failures.

As evidenced from the above discussion, it is desirable to provide an electroluminescent device with reliable encapsulation.

SUMMARY OF THE INVENTION

The invention relates sealing for electroluminescent devices. The electroluminescent device includes a substrate with a active region on which at least one OLED cell is formed. A cap bonding region surrounds the active region. A protection layer, such as photoresist, is provided in the active region to which a cap is bonded. The protection layer enables the removal of polymer materials used to form the OLED cells to be removed from the cap bonding region without damaging the layers below it. This improves the sealing between the cap and substrate.

PREFERRED EMBODIMENTS OF THE INVENTION

Figure 1:
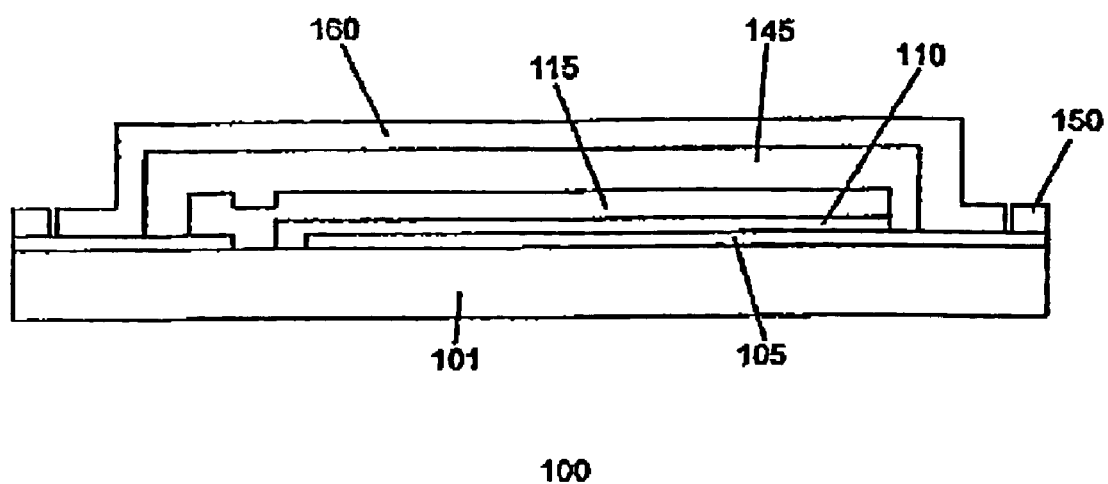
FIG. 1 shows a conventional OLED device.
Figure 2:
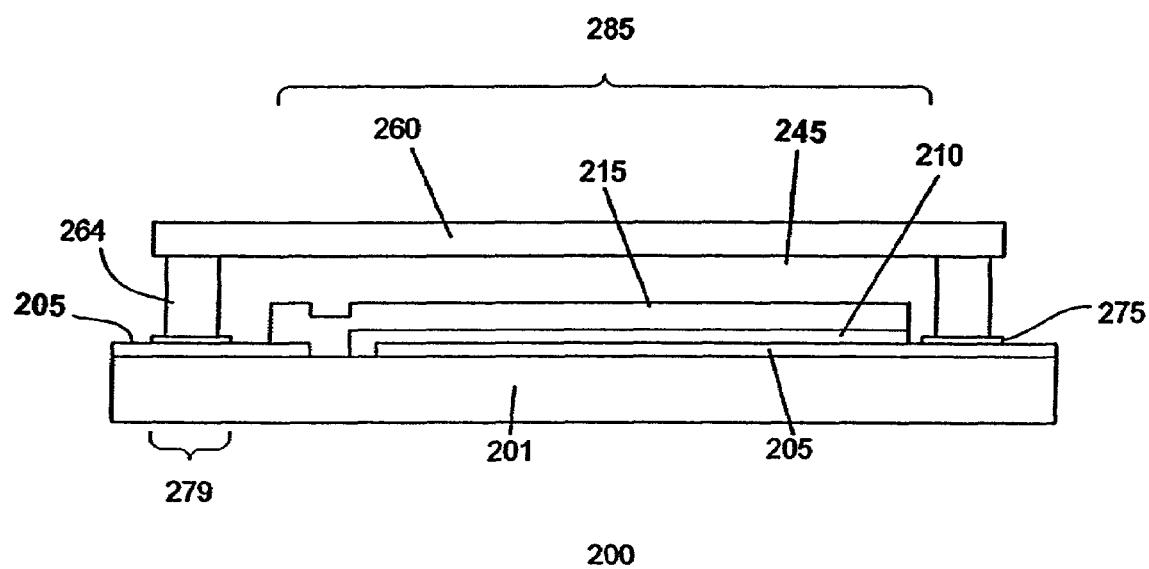
FIG. 2 shows an embodiment of the invention.

FIG. 2 shows an electroluminescent device 200 in accordance with one embodiment of the invention. The device comprises a substrate 201 having an active region 285 in which one or more OLED cells are formed. In one embodiment, the substrate comprises a transparent substrate, such as glass. Other types of transparent materials that can serve as a substrate to support the OLED cells are also useful. For example, plastic films can be used to serve as a substrate. Plastic materials are particularly useful to form flexible devices. The use of non-transparent materials is also useful, particularly for applications which view through the cap.

An OLED cell comprises one or more organic layers (polymer stack) 210 sandwiched between first and second electrodes 205 and 215. In one embodiment, a hole injection layer (HIL) is included in the polymer stack 210. The HIL, for example, comprises a polymer blend, which typically contains poly(aniline) (Pani) or poly (ethylenedioxythiophene) (Pedot). The first electrode 205 serves as, for example, the anode while the second electrode serves as the cathode. At least one of the electrodes is transparent. Transparent conductive materials, such as indium tin oxide (ITO), can be used to form the transparent electrodes. In one embodiment, the first or bottom electrode is transparent. For applications which view through the cap, the second or top electrode is transparent.

The cathodes and anodes can be patterned as desired to form one or more OLED cells. For example, the cathodes and anodes are formed as strips in respective first and second directions, creating a pixelated device. Other patterns are also useful. Typically, the first and second directions are orthogonal to each other. Bond pads (not shown) are electrically coupled to the cathodes and anodes.

A cap 260 is bonded to the substrate in the cap bonding region 279 surrounding the active region, encapsulating the OLED cells. The cap creates a cavity 245 to protect the cells from being damaged by physical contact with the cap. In one embodiment, the cap comprises a cap substrate with a sealing rim or gasket formed thereon. The cap substrate can be formed from, for example, glass. Other materials which can serve as a cap substrate, such as metal or ceramic, can also be used. The sealing rim, for example, can be formed from photoresist. Other types of materials, such as silicate glass, silicon-dioxide, or ceramic can also be used. An adhesive is used to bond the cap to the substrate. The adhesive, for example, comprises resins based on epoxy, silicone, urethane, acrylate or olefinic chemistries. The resin can be a UV or thermally curable resin. Providing a sealing rim formed from an epoxy adhesive is also useful. Alternatively, the cap is a pre-formed cap comprising, for example, pressed metal or etched glass.

The active area of the device can, for example, include shaped pillars. The shaped pillars, which comprise an undercut, are used to pattern the top electrodes. The use of shaped pillars is described in, for example, "Production of Structured Electrodes" (US 2001/0017516A1) and "Patterning of Electrodes in OLED Devices" (PCT/SG00/00134), which are herein incorporated by reference for all purposes. Alternatively or in addition to shaped pillars, spacer particles can be provided on the substrate. The spacer particles serve to support the cap, preventing it from contacting the OLED cells. The use of spacer particles is described in, for example, "Encapsulation of Electronic Devices" (U.S. Ser. No. 09/989, 362); "Improved Encapsulation of Organic LED devices" (PCT/SG99/00145); "Organic LED Device with Improved Encapsulation" (PCT/SG99/00143); and "Improved Encapsulation for Organic LED Device" (PCT/SG99/00145), which are herein incorporated by reference for all purposes.

In accordance with one embodiment of the invention, a surface protection layer 275 is provided on the substrate in the cap bonding area. The cap contacts the surface protection layer. Various layers beneath the surface protection layer, for example, metal interconnects for the electrodes and/or electrodes such as ITO, are protected from damage during removal of the polymer material. Since the surface protection layer serves as part of the encapsulation, it should exhibit sufficient mechanical stability, good adhesion properties and low permeation rates to ensure good sealing between the cap and substrate. If the surface protection layer is directly over metal interconnects, it should be formed from an insulating material. Preferably, the surface protection layer is formed from a material which is compatible with the OLED fabrication process. Typically, the thickness of the surface protection layer is about 0.5-50 um. Other thicknesses may also be useful. In one embodiment, the surface protection layer comprises photoresist. Other types of photosensitive materials, such as polyimide, are also useful. Non-photosensitive materials, such as resins or non-photosensitive polyimide, can also be used.

Figure 3:
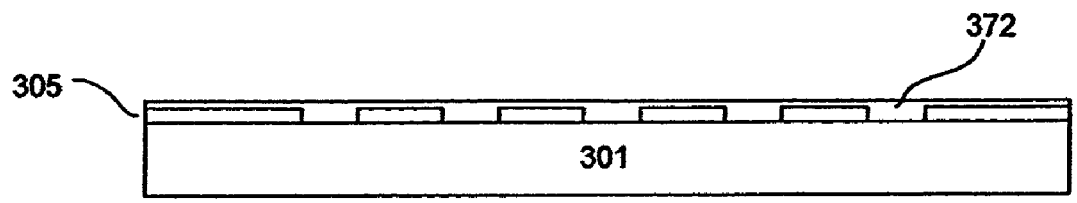
FIGS. 3-7 show a process for fabricating an OLED device in accordance with one embodiment of the invention.

FIGS. 3-7 show a process for fabricating an OLED device in accordance with one embodiment of the invention. Referring to FIG. 3, a substrate 301 is provided. In one embodiment, the substrate comprises a transparent substrate, for example, soda lime or borosilicate glass. Other types of transparent materials can also be used to serve as the substrate. The substrate typically is about 0.4-1.1 mm thick.

In another embodiment, the substrate comprises a thin flexible substrate. Thin flexible substrates are formed from, for example, plastic films such as transparent poly(ethylene terephthalate) (PET), poly(butylene terephthalate) (PBT), poly(ethylene napthalate) (PEN), polycarbonate (PC), polyimides (PI), polysulfones (PSO), and poly(p-phenylene ether sulfone) (PES). Other materials such as polyethylene (PE), polypropylene (PP), poly(vinyl chloride) (PVC), polystyrene (PS) and poly(methyl methacrylate) (PMMA), can also be used to form the substrate. Alternatively, materials such as ultra thin glass (e.g., thickness between 10-100 um), a composite stack comprising glass and polymer or polymer films coated with inorganic barrier layers can also be used.

The substrate includes first electrodes 305 formed on the surface thereof. The first electrodes serve as, for example, anodes. The anodes can be formed by, depositing and patterning a conductive layer on the substrate. Various techniques, such as photolithography, can be used to pattern the conductive layer. In one embodiment, the anodes are arranged in strips in a first direction. Anodes having other patterns are also useful. In one embodiment, the conductive material comprises a transparent conductive material such as indium-tin-oxide (ITO). Other transparent conductive materials, for example, indium-zinc-oxide, zinc-oxide, tin-oxide, are also useful.

Bond pads and other interconnects may also be included on the substrate. The bond pad and interconnects are formed by depositing and patterning a conductive layer. The conductive layer comprises, for example, a metal such as Al, Ag, Au, Cr. Patterning of the conductive layer can be achieved using conventional mask and etch techniques.

Figure 4:

A device layer 372 is deposited over the substrate. The device layer, in one embodiment, comprises photoresist. Various types of photoresist, for example, positive or negative acting, can be used. Other types of photosensitive materials or non-photosensitive materials can also be used. The device layer is then patterned to form a surface protection layer 475 in the cap bonding region 479 of the substrate, as shown in FIG. 4. If a photosensitive device layer is used, it is patterned by selectively exposing portions and removing the exposed or unexposed portions, depending on whether a positive or negative photosensitive material is used. On the other hand, conventional mask and etch techniques can be used to pattern a non-photosensitive device layer.

Figure 5:
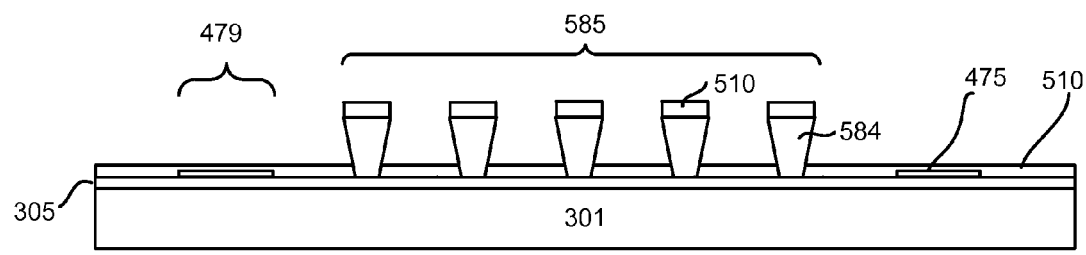

Referring to FIG. 5, the process continues to complete the fabrication of the OLED device. Various conventional techniques can be used to complete the OLED device. In one embodiment, shaped pillars 584 are formed on the substrate. The shaped pillars comprises an undercut, for example a v-shape profile, to sufficiently interrupt the conductive layer during deposition to form the electrodes. Preferably, the shaped pillars are formed from a single layer of material. In one embodiment, the shaped pillars are formed from a single layer comprising a negative photoresist. Other types of photosensitive materials can also be used. Non-photosensitive materials can also be used to form shaped pillars. Alternatively, the shaped pillars are formed from multiple layers to create a t-shaped profile. The multiple layers can be formed from photosensitive and/or non-photosensitive materials.

After the pillars are formed, a functional organic layer 510 is deposited on the substrate. In one embodiment, the functional organic layer comprises a conjugated polymer. Other types of polymer materials are also useful. The polymer is deposited by, for example, spin-coating. Other deposition techniques can also be used. Additional functional layers can be deposited to form a functional organic stack. Different types of polymers can be deposited to form a multi-color OLED device.

Figure 6:
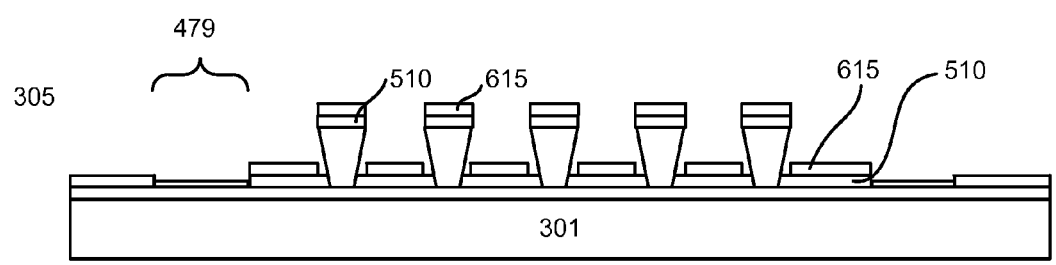

Referring to FIG. 6, a second conductive layer 615 is deposited on the substrate. The conductive layer comprises, for example, Ca, Mg, Ba, Ag, Al or a mixture or alloy thereof. Other conductive materials, particularly those comprising a low work function, can also be used to form the second conductive layer. Alternatively, the second conductive layer comprises an ionic compound, such as LiF, MgF, or CsF. In one embodiment, the second conductive layer comprises Ca. The Ca layer is deposited by, for example, thermal evaporation at a rate of 1 nm/s and a pressure of about $10^{-5}$ mbar. Alternatively, the second conductive layer comprises a composite layer or stack of multiple conductive layers. For example, the stack comprises a first layer of Ca followed by a second conductive layer of Ag or Al. Various deposition techniques, such as, thermal evaporation, sputtering (PVD), chemical vapor deposition (CVD), plasma enhanced chemical vapor deposition (PECVD) or metal organic chemical vapor deposition (MOCVD), can be used to form the second conductive layer. Preferably, a shadow mask is used to deposit the second conductive layer in the active area 585 of the device. The deposition of the second conductive layer is interrupted by the pillars, creating second electrodes or cathodes. The intersections of the cathodes and anodes form OLED cells.

The polymer layer in the cap bonding region is removed or etched by, for example, laser ablation. In one embodiment, the polymer is removed prior to the formation of second electrodes. Patterning the polymer layer after formation of the second electrodes can also be useful. To ensure that the polymer is completely removed, an overetch is performed. The overetch also partially removes the surface protection layer. However, no damage occurs in the metal interconnects from the laser ablation since they are protected by the surface protection layer.

Figure 7:
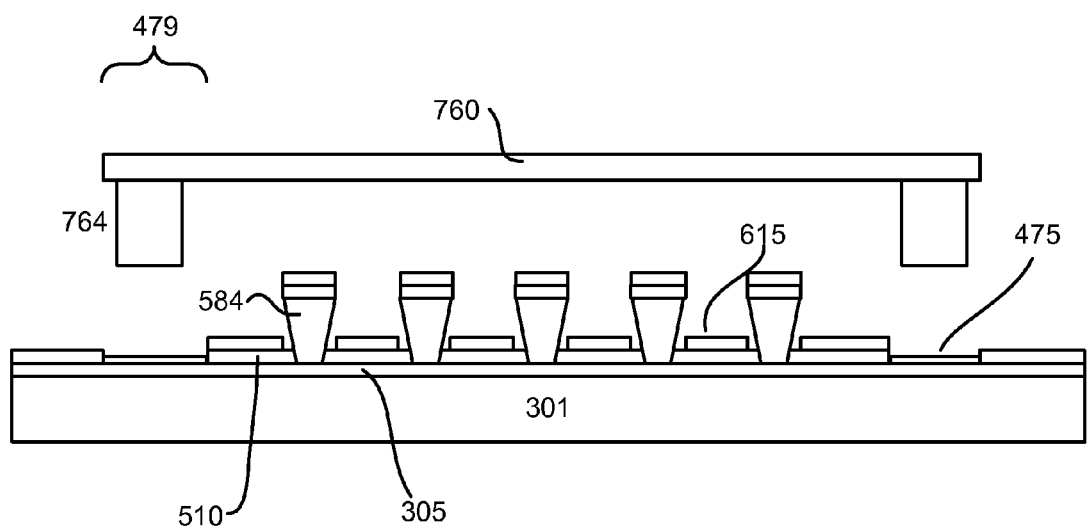

As shown in FIG. 7, the OLED device is completed by mounting a cap 760 to the cap bonding region of the substrate. The surface protection layer and cap sealing rim forms an interface between the cap and substrate. An adhesive resin can be used to bond the cap to the substrate. In one embodiment, the adhesive exhibits good bonding and barrier property between the substrate and cap to hermetically seal the OLED cells. Various types of resins, such as those based on epoxies, silicons, urethanes, acrylates or olefins can be used. The resin can either be a UV or thermally curable resin. Through the use of a protection layer, there is flexibility in designing a sealing system (e.g., adhesive, cap material, and protection layer material) having the desired properties.

After the OLED device is encapsulated, the polymer material outside the active area can be removed to expose the bond pads using, for example, a wet etch. Since the active area of the device is sealed, the chemicals will not adversely impact the OLED cells.

In a preferred embodiment, the surface protection layer is formed as part of the existing process for fabricating the OLED device. For example, a portion of the resist layer can remain on the substrate after the formation bond pads and interconnects to serve as the surface protection layer. Alternatively, the device layer used to form the shaped pillars can advantageously be patterned to include the surface protection layer.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. An electroluminescent device comprising:
    a substrate having an active region having at least one OLED cell;
    an organic layer on the substrate in the OLED cell;
    a cap bonding region surrounding the active region;
    a photosensitive material forming a device layer, the photosensitive material having a first region of a first thickness that is covered by the organic layer and a second region of a second thickness less than the first thickness that is not covered by the organic layer and is located in the cap bonding region, wherein the first region and the second region each has a lower surface facing the substrate and an upper surface remote from the substrate, and the upper surface of the first region is not planar with the upper surface of the second region;
    a cap bonded to the substrate in the cap bonding region; and
    an adhesive used to bond the cap to the substrate.

2. The electroluminescent device of claim 1 wherein the photosensitive material comprises photoresist or polyimide.

3. The electroluminescent device of claim 1 wherein the cap, the second region of the device layer and the adhesive form a sealing system.

4. The electroluminescent device of claim 3 wherein materials of the sealing system are selected to provide desired sealing characteristics.

5. The device of claim 1, further comprising a functional organic layer at least in the active region, the functional organic layer being co-planar with the device layer and extending at least to an edge of the second region of the device layer, but not extending into the cap bonding region.

6. An electroluminescent device comprising:
    a substrate having an active region having at least one OLED cell;
    an organic layer on the substrate in the OLED cell;
    a cap bonding region surrounding the active region;
    a non-photosensitive polyimide layer forming a device layer, the non-photosensitive polyimide layer having a first region of a first thickness that is covered by the organic layer and a second region of a second thickness less than the first thickness that is not covered by the organic layer and is located in the cap bonding region, wherein the first region and the second region each has a lower surface facing the substrate and an upper surface remote from the substrate, and the upper surface of the first region is not planar with the upper surface of the second region;
    a cap bonded to the substrate in the cap bonding region; and
    an adhesive used to bond the cap to the substrate.

7. The electroluminescent device of claim 6 wherein the cap, the second region of the device layer and the adhesive form a sealing system.

8. The electroluminescent device of claim 7 wherein materials of the sealing system are selected to provide desired sealing characteristics.

9. The electroluminescent device of claim 6 wherein the adhesive comprises a resin.

10. The electroluminescent device of claim 9 wherein the cap, the second region of the device layer and the adhesive form a sealing system.

11. The electroluminescent device of claim 10 wherein materials of the sealing system are selected to provide desired sealing characteristics.

12. An electroluminescent device, comprising:
    a substrate having an active region having at least one OLED cell;
    an organic layer on the substrate and in the OLED cell;
    a cap bonding region surrounding the active region;
    a photosensitive layer forming a device layer, the photosensitive layer having a first region of a first thickness that is covered by the organic layer and a second region of a second thickness less than the first thickness that is not covered by the organic layer and is located in the cap bonding region and forming a step, wherein the first region and the second region each has a lower surface facing the substrate and an upper surface remote from the substrate, and the upper surface of the second region is closer to the substrate than the upper surface of the first region;
    a cap bonded to the substrate in the cap bonding region; and
    an adhesive directly on the second region of the device layer used to bond the cap to the substrate.

* * * * *